(12) United States Patent
Huo (10) Patent No.: US 10,573,658 B2
(45) Date of Patent: Feb. 25, 2020

(54) METHOD OF MANUFACTURING THREE-DIMENSIONAL VERTICAL AND SEMICONDUCTOR DEVICE

(71) Applicant: Institute of Microelectronics, Chinese Academy of Sciences, Chaoyang, District, Beijing (CN)

(72) Inventor: Zongliang Huo, Zhongguancun (CN)

(73) Assignee: Institute of Microelectronics, Chinese Academy of Sciences (CN)

( * ) Notice: Subject to any disclaimer, the term of this patent is extended or adjusted under 35 U.S.C. 154(b) by 0 days.

(21) Appl. No.: 15/311,000

(22) PCT Filed: Jul. 10, 2014

(86) PCT No.: PCT/CN2014/081924
§ 371 (c)(1),
(2) Date: May 9, 2017

(87) PCT Pub. No.: WO2015/172428
PCT Pub. Date: Nov. 19, 2015

(65) Prior Publication Data
US 2017/0250193 A1    Aug. 31, 2017

(30) Foreign Application Priority Data

May 16, 2014    (CN) .......................... 2014 1 0207317

(51) Int. Cl.
*H01L 27/11582*    (2017.01)
*H01L 21/324*    (2006.01)
*H01L 21/28*    (2006.01)

(52) U.S. Cl.
CPC ...... *H01L 27/11582* (2013.01); *H01L 21/324* (2013.01); *H01L 21/3247* (2013.01); *H01L 29/40117* (2019.08)

(58) Field of Classification Search
CPC .......... H01L 27/11582; H01L 21/3247; H01L 29/40117; H01L 21/324; H01L 27/11578
See application file for complete search history.

(56) References Cited

U.S. PATENT DOCUMENTS

| 2012/0256247 | A1  | 10/2012 | Alsmeier |
| 2012/0275220 | A1  | 11/2012 | Liu et al. |
| 2012/0276702 | A1  | 11/2012 | Yang et al. |
| 2013/0134492 | A1* | 5/2013  | Yang ................... H01L 27/1157 257/314 |
| 2014/0084358 | A1  | 3/2014  | Lee et al. |

FOREIGN PATENT DOCUMENTS

| CN | 102315222 | 1/2012 |
| CN | 103620789 | 3/2014 |

* cited by examiner

*Primary Examiner* — William F Kraig
*Assistant Examiner* — Vicki B. Booker
(74) *Attorney, Agent, or Firm* — Dickinson Wright PLLC (57) ABSTRACT

A method of manufacturing three-dimensional semiconductor device includes the steps of: forming a stack structure of a plurality of a first material layers and a second material layers on a substrate in the memory cell region; etching the stack structure to form a plurality of trenches; forming channel layers in the plurality of trenches; and reducing the surface roughness and the interface state by performing annealing treatment to at least one surface of the channel layers.

16 Claims, 7 Drawing Sheets

METHOD OF MANUFACTURING THREE-DIMENSIONAL VERTICAL AND SEMICONDUCTOR DEVICE

CROSS-REFERENCE TO RELATED APPLICATIONS

The present application is a 35 U.S.C. Section 371 national stage filing of International Patent Application No. PCT/CN2014/081924, filed 10 Jul. 2014, and through which priority is claimed to Chinese Patent Application 201410207317.2, filed 16 May 2014, the disclosures of which are incorporated herein by reference in their entireties.

TECHNICAL FIELD

The present invention relates to a method of manufacturing semiconductor device, particularly to a method of manufacturing three-dimensional semiconductor device which can effectively improve the channel carrier mobility.

BACKGROUND TECHNIQUE

In order to improve the density of the memory device, the industry has worked extensively at developing a method for reducing the size of a two-dimensional arrangement of memory cells. As the size of the memory cells of the two-dimensional (2D) memory devices continues to shrink, signal conflict and interference will significantly increase, so that it is difficult to perform operation of multi-level cell (MLC). In order to overcome the limitations of 2D memory device, the industry has developed a memory device having a three-dimensional (3D) structure to improve the integration density by three-dimensionally arrange the memory cell d on the substrate.

Specifically, a multilayer laminated structure (e.g., a plurality of ONO structures of alternating oxide and nitride) may firstly deposited on the substrate; by an anisotropic etching process for etching the multilayer laminated structure on the substrate, a plurality of channel through-holes distributed along the word line (WL) of memory cell extending direction and perpendicular to the substrate surface are formed (may extend through to the substrate surface or with a certain over-etch); a plurality of pillar-shaped channels are formed in the channel through-holes by depositing polycrystalline silicon material; the multilayer laminated structure is etched along the WL direction to form a plurality of trenches through to the substrate, exposing the multilayer stack surrounding the pillar-shaped channels; a certain type of materials in the stack is removed by wet etching (e.g., using hot phosphoric acid to remove nitrogen silicon, or HF to remove silicon oxide), leaving a plurality of projecting structures laterally distributed around the pillar-shaped channels; a gate dielectric layer (such as high-k dielectric materials) and a gate conductive layer (e.g., Ti, W, Cu, Mo, etc.) are deposited on the side walls of the projecting structures in the trenches to form a gate stack; a portion of the gate stack out of the lateral plane of the projecting structures is removed by vertical anisotropic etching until the gate dielectric layer on the side of the projecting structures is exposed; the laminated structure is etched to form a plurality of source/drain contacts, and rear end of the manufacturing processes are completed. Here, a portion of projecting structures of the laminated structure leaving on the sidewall of pillar-shaped channels forms a plurality of spacers between the gate electrodes, leaving the gate stacks sandwiched between the spacers as control electrodes. When a voltage is applied to the gates, the fringe field of the gate will enable a plurality of source and drain regions to be formed on sidewalls of pillar-shaped channels made of e.g. polycrystalline silicon material, thereby constituting a gate array composed of a plurality of MOSFETs series-parallel coupled to record the stored logic states.

In above device structure, the control gate and the gate dielectric layer (typically a silicon nitride based dielectric, with simple process and good bottom contact characteristics) surround polycrystalline silicon channel layer which is usually hollow pillar-shape (with better control for sub-threshold characteristic control), the inner side of the pillar-shaped channel layer may be further filled with dielectric layer (e.g., silicon oxide, in order to facilitate integration). However, studies show that the growth temperature of oxide in the gate-last process can greatly affect the thinning of native oxide and its surface roughness (an extremely thin silicon oxide layer formed due to local heating and other factors during the formation of the polycrystalline silicon channel layer) at the interface between the polycrystalline silicon channel layer, the gate dielectric layer and the filled dielectric layer, furthermore the interface state defects caused by the surface roughness, as well as a large number of gaps and gap interface states between the crystalline grains inside the polycrystalline silicon channel layer make the channel carrier mobility of the device decreased, thereby reduce the memory cell reliability.

SUMMARY OF THE INVENTION

From the above, an object of the invention lies to overcome the above-mentioned technical difficulties, and propose an innovative three-dimensional semiconductor device manufacturing method.

In one aspect of the present invention, there is provided a method of manufacturing three-dimensional semiconductor device, comprising the steps of: forming a stack structure of a plurality of a first material layers and a second material layers on a substrate in the memory cell region; etching said stack structure to form a plurality of trenches; forming channel layers in said plurality of trenches; performing annealing treatment to at least one surface of the channel layers to reduce the surface roughness and the interface state.

Wherein, before forming said channel layers, further comprising forming the dummy channel sacrificial layer on sidewalls of said plurality of trenches.

Wherein, the material of said dummy channel sacrificial layer comprises silicon nitride, silicon oxynitride or combinations thereof, and having a high etching selectivity ratio to the material of the first material layers and/or the second material layers.

Wherein, after forming said channel layers but before said annealing treatment, further comprising forming a buffer layer on at least one surface of said channel layers.

Wherein, the material of the buffer layer includes silicon oxide, silicon nitride, silicon oxynitride, and combinations thereof.

Wherein said buffer layer is formed on the surface of said channel layers facing towards and/or away from said stack structure.

Wherein, said annealing treatment is performed at a gas atmosphere containing nitrogen group, fluoro group, chloro group, bromo group, or combinations thereof.

Wherein, after the surface of the channel layer facing away from said stack structure is annealed, filling the channel layers with an insulating spacer layer and forming drain regions of the device transistor.

Wherein, after the formation of said drain regions, further comprising selectively removing the second material layers, leaving the discrete vertical stack structure on a substrate, exposing the surface of the channel layers facing towards said first material layers.

Wherein, the surface of the channel layers facing towards said first material layers are annealed.

Wherein, before the annealing treatment of the surface of the channel layers facing towards said first material layers, further comprising forming a buffer layer on the surface of the channel layers facing towards said first material layers.

Wherein, after said annealing treatment of at least one surface of the channel layers, further comprising forming a plurality of lateral recesses on sidewalls of said plurality of trenches in said stack structure, and then forming a plurality of gate stack structure composed of the gate dielectric layer and the gate conductive layer in said plurality of recesses; forming a plurality of source electrodes in said substrate.

Wherein, said gate dielectric layer further comprises a tunneling layer, a storage layer and a barrier layer.

Wherein, between said gate dielectric layer and said gate conductive layer may also include a metal nitride layer.

Wherein, the cross-sectional shape of the channel layers parallel to the substrate surface comprises geometric shapes selected from rectangular, square, diamond, circular, semi-circular, elliptical, triangular, pentagonal, pentagonal, hexagonal, octagonal and the combinations thereof, and includes those selected from solid geometry, hollow annular geometry, or a combination of a hollow annular peripheral layer and a central insulating layer as a result of revolution of geometric shapes.

Wherein, the materials of both said first material layers and second material layers include insulating material, furthermore the first material layers have a first etch selectivity, and the second material layers have a second etch selectivity which is different from the first etch selectivity.

Wherein, said material of the first material layers comprise insulating material, said material of the second material layers may comprise doped semiconductor material or conductive material used to form the control gates.

In accordance with the three-dimensional semiconductor device manufacturing method of the present invention, a dummy channel sacrificial layer is introduced for the interface treatment on the channel surface and back surface, which depresses the formation of interface states, and/or a buffer layer on the channel surface and back surface is introduced during the treatment, which can reduce the channel surface roughness, thereby improving the channel carrier mobility and memory cell reliability as well as the channel current.

BRIEF DESCRIPTION OF THE DRAWINGS

Referring to the following drawings, the technical solutions of the present invention are described in detail, in which.

DETAILED DESCRIPTION

The features and technical effects of the present invention will be described in detail with reference to the drawings and schematic embodiments, disclosing a semiconductor device manufacturing method for effectively improving the reliability of the device. It should be noted that the similar reference numbers denote the similar structure. The terms used in the present invention like "first", "second", "up/upon", "down/low/beneath/under" etc. can be used in denoting various device structures, and do not indicate the relationship in space, sequence or hierarchy of the device structures unless specially illuminated these terms, if not stated otherwise.

Figure 1:
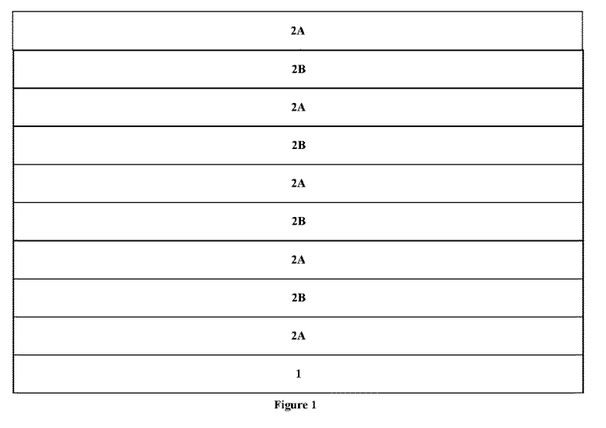
FIGS. 1 to 17 are cross-sectional views of the various steps of the three-dimensional semiconductor device manufacturing method in accordance with the present invention.

As shown in FIG. 1, a stack structure 2 composed of a plurality of first material layers 2A and a plurality of second material layers 2B is formed alternately on the substrate 1. The material of substrate 1 may comprise a bulk silicon (bulk Si), bulk germanium (bulk Ge), silicon-on-insulator (SOI), germanium-on-insulator (GeOI), or other compound semiconductor substrate, e.g., SiGe, SiC, GaN, GaAs, InP and the like, and combinations of these substances. For compatibility with the existing IC fabrication process, the substrate 1 is preferably a substrate containing silicon material, e.g., Si, SOI, SiGe, Si:C and the like. The material of the stack structure 2 is selected from combination of the following material and comprises at least one insulating dielectric: e.g. silicon oxide, silicon nitride, polycrystalline silicon, amorphous silicon, amorphous carbon, diamond-like carbon (DLC), germanium oxide, aluminum oxide, aluminum nitride, metals or the like and combinations thereof. The first material layers 2A have a first etch selectivity, and the second material layers 2B have a second etch selectivity which is different from the first etch selectivity. In one preferred embodiment of the invention, laminate structures 2A/2B are both made of insulating material, and the combination of layers 2A/2B is a combination of silicon oxide and silicon nitride, a combination of silicon oxide and polycrystalline silicon or amorphous silicon, a combination of silicon oxide and silicon nitride or amorphous carbon and the like, for example. In another preferred embodiment of the present invention, the material of one of the laminated structures 2A/2B is selected from metal, metal alloy, metal nitride, polycrystalline silicon (preferably doped) or the like, used for the control gate material in the gate-first process, the other is one of insulating materials as mentioned above, used to form the insulating spacer layer between the control gates in the gate-first process. In a preferred embodiment of the invention, the layers 2A have a relatively greater etching selectivity ratio (for example greater than 5:1) to layers 2B at wet etching conditions or oxygen plasma dry etching conditions. The method for depositing layers 2A, 2B comprises PECVD, LPCVD, HDPCVD, MOCVD, MBE, ALD, thermal oxidation, evaporation, sputtering, and other processes. In the structure of the embodiment shown in FIG. 2, layers 2A are for example silicon oxide layer, layers 2B are for example silicon nitride layer.

Figure 2:
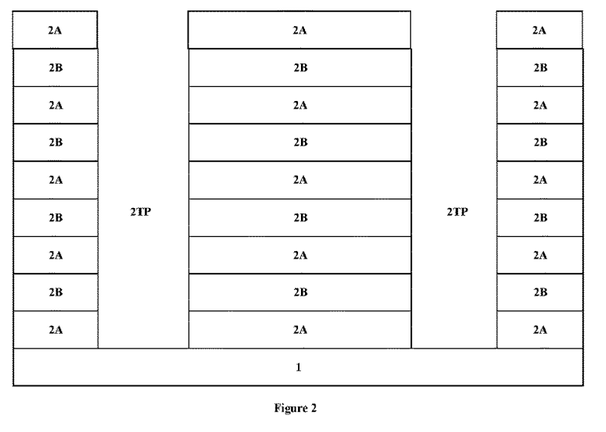

As shown in FIG. 2, the stack structure 2 is etched through till the substrate 1 is exposed, forming a plurality of trenches 2TP vertically punching through the stack structure for defining the channel regions. Preferably, the stack structure 2 of layers 2A/layers 2B is anisotropically etched by RIE or plasma dry etching, exposing the substrate 1 and the sidewalls of layers 2A/2B alternately stacked thereon. More preferably, the process conditions of anisotropic etching of stack structure are controlled in order to make the lateral etching rate being significantly less than the longitudinal etching rate, obtaining a plurality of vertical deep holes or deep trenches 2TP with high aspect ratio (e.g., aspect ratio AR being greater than or equal to 10:1). The cross-sectional shape of the trenches 2T by cutting parallel to the surface of substrate 1 may be various geometric shapes selected from rectangular, square, diamond, circular, semi-circular, elliptical, triangular, pentagonal, hexagonal, octagonal, etc.

Figure 3:
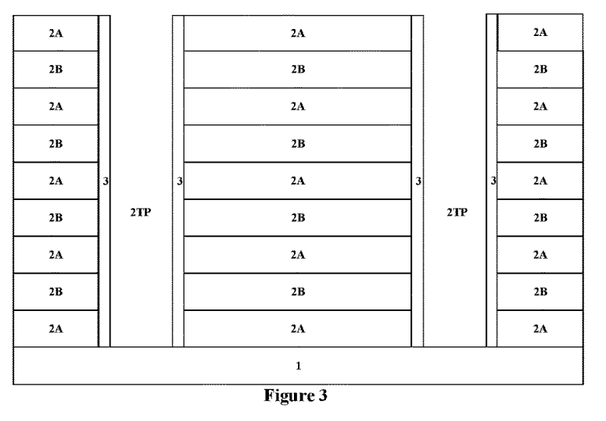

As shown in FIG. 3, a dummy channel sacrificial layer 3 is formed on sidewalls of the trenches 2TP. The dummy channel sacrificial layer 3 is deposited on sidewalls of the trenches 2TP by process such as PECVD, HDPCVD, MBE, ALD, evaporation, sputtering, etc., of which the preferred material has high etching selectivity ratio to said material of the first material layers and/or the second material layers, for example, silicon nitride, silicon oxynitride or combinations thereof, in order to temporarily protect the side of the channel layers facing towards sidewalls of the trenches 2TP in subsequent processes, thereby reducing interface defects of future channel layers on this side. The thickness of the dummy channel sacrificial layer 3 is preferably less than or equal to 5 nm, e.g. 1-4 nm and preferred 2 nm.

Figure 4:
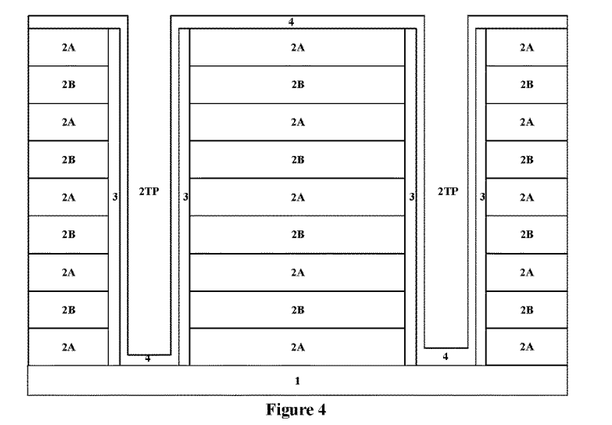

As shown in FIG. 4, the channel layers 4 are formed at the bottom of the trenches 2TP and on sidewalls of the dummy sacrificial layer 3 (and preferably on the top of the stack structure 2). The material of the channel layers 4 may comprise monocrystalline silicon, amorphous silicon, polycrystalline silicon, microcrystalline silicon, monocrystalline germanium, SiGe, Si:H, SiGe:C, SiGe:H and other semiconductor materials, formed by the deposition process described above. In one embodiment of the present invention shown in FIG. 4, the deposition process of channel layers 4 is partially filling the sidewalls of trenches 2TP to form hollow cylinders with air gaps. In other embodiments of the present invention not shown, the deposition process of channel layers 4 is chosen to completely or partially fill the trenches 2TP, thereby forming a plurality of solid columns, hollow rings, or core-shell structures having hollow rings with filled insulating layer (not shown). The shape of the horizontal cross section of channel layers 4 is similar and preferably conformal to those of trenches 2TP, and can be various solid geometric shapes, such as rectangle, square, diamond, circular, semi-circular, elliptical, triangular, pentagonal, hexagonal shaped, octagonal etc., or annular or tubular hollow structures evolved from geometric shapes described above (and its interior may be filled with insulating layers).

Figure 5:
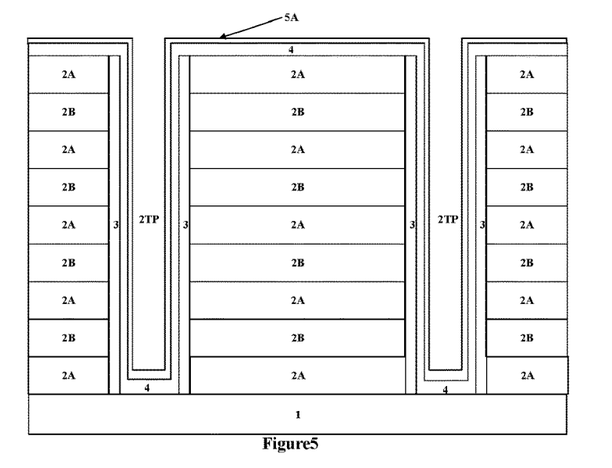
Figure 11:
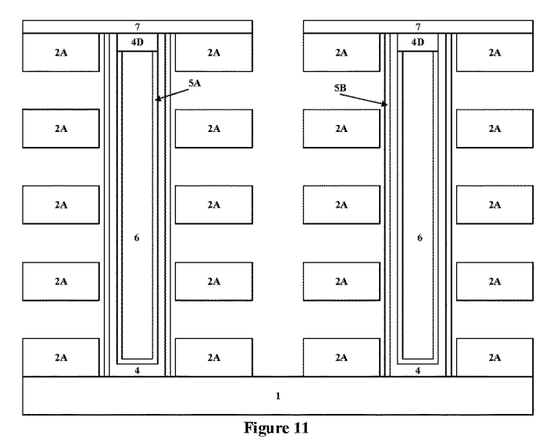

Optionally, as shown in FIG. 5, the buffer layer 5A is formed above the channel layers 4 (on the side back away from sidewalls of the stack structure 2 shown in the figure, i.e. on the back surface of the channel layer 4), in order to further reduce surface defects during the subsequent surface treatment process of the channel layers, e.g., the interface state density can be reduced. The formation process can be selected from thermal oxidation, LPCVD, PECVD, HDPCVD, MBE, ALD, and etc., the material of the buffer layer 5A is for example selected from silicon oxide, silicon nitride, silicon oxynitride or combinations thereof, with a thickness of 0.5-5 nm, preferably 1-3 nm, with the optimum 2 nm. It is worthily noted that, as shown in FIG. 5 and FIG. 11, all the steps of forming the buffer layer 5A/5B on both sides of the channel layers 4 are optional, i.e., the buffer layer may be a single layer above the channel layers, or double-sided buffer protection structure, or it may not be formed.

Figure 6:
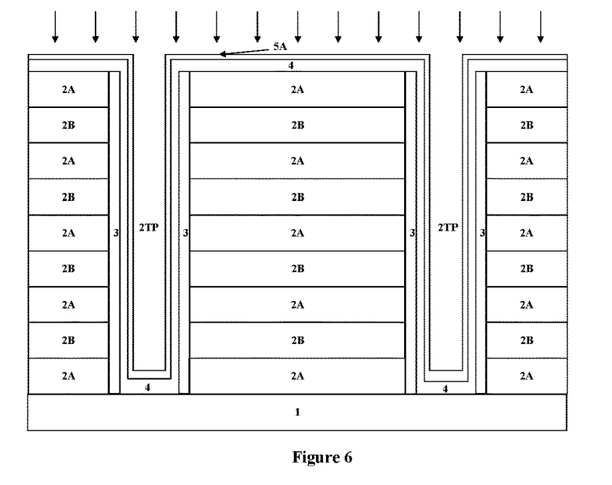
Figure 12:
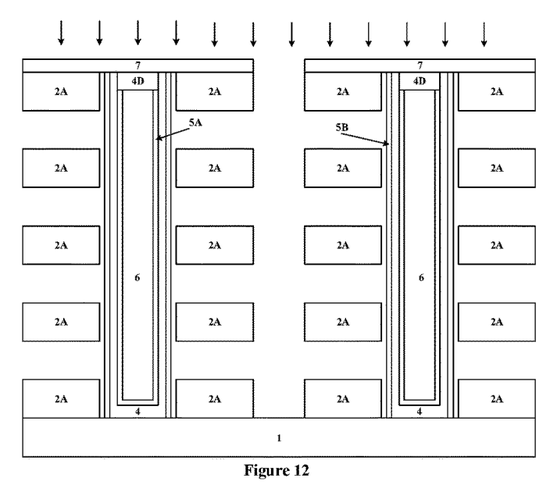

Thereafter, optionally, as shown in FIG. 6, implementing a first annealing process, performing treatment on the back surface of the channel layers 4 (the side where the buffer layer 5A is formed, i.e., the side facing back away from the stack structure 2), in order to depress interface state defects on the back surface of the channel layers 4, thereby improving the reliability of the device. The annealing process can be performed at an atmosphere added by the interface processing gases, the gases comprise nitrogen group, fluoro group, chloro group, bromo group and combinations thereof, for example, one or compounded gases selected from $NH_3$, $N_2$, NO, $F_2$, $NF_3$, HF, HBr, $BCl_3$, HCl, and etc. The annealing process includes for example spike annealing, laser annealing, rapid annealing, etc., the annealing temperature is for example 500-1000° C. and preferably 650-850° C., the annealing time is for example 10 seconds to 60 minutes and preferably 30 seconds to 5 minutes, or 10 to 30 minutes. It is worthily noted that, the annealing processes shown in FIG. 6 and later in FIG. 12 are both optional, i.e. the annealing process can be performed on any side, and/or on both sides of the channel layers 4.

Figure 7:
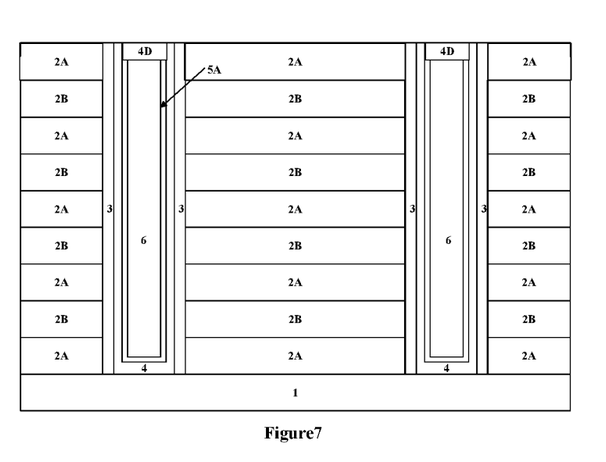

As shown in FIG. 7, the insulating spacer layer 6 is filled in the trenches 2TP and on the channel layers 4, the material of the insulating spacer layer 6 includes for example silicon oxide, silicon nitride, silicon oxynitride, and combinations thereof. Preferably, layer 4, 5A and 6 are flatten using processes such as CMP, until the top of the stack structure 2 is exposed. Preferably, the top of layer 5A and layer 6 are partially etched to expose the top of the channel layers 4, materials as same as or similar to those of the channel layers 4 (e.g., materials similar to Si, such as SiGe, SiC, etc., in order to fine-tune the lattice constants and improve the carrier mobility, thereby controlling the driving performance of the cell device) are deposited on the top to form the drain regions 4D of the memory device cell transistors.

Figure 8:
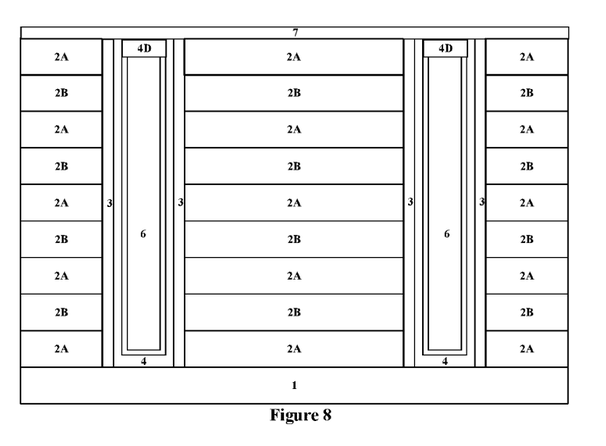

As shown in FIG. 8, an insulating mask layer 7 is deposited on the top of the entire device, in order to define the gate regions shown later in FIG. 9. The material of the insulating mask layer 7 is for example silicon nitride, and the deposition process is for example PECVD, or HDPCVD.

Figure 9:
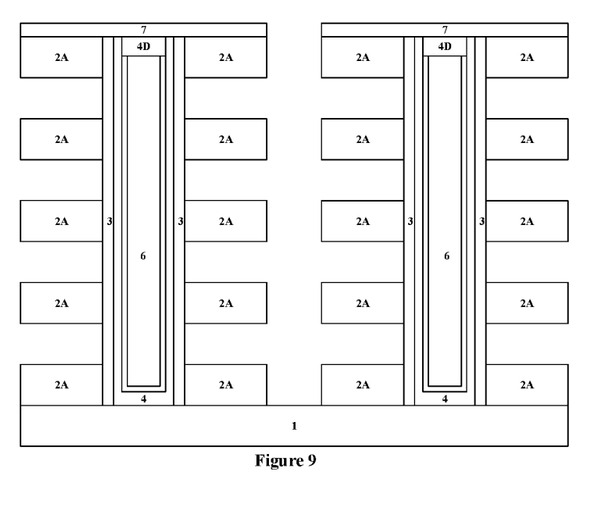

As shown in FIG. 9, using the insulating mask layer 7 as a mask, by way of anisotropic dry etching process, layers 2B and layers 2A of the stack structure 2 are sequentially vertically etched until substrate 1 is exposed, leaving a plurality of discrete stack structures on substrate 1.

Furthermore, using the anisotropic selective etching process (preferably wet etching), one type of the layers of the stack structure 2 is removed, for example, layers 2B are removed as shown in FIG. 9, leaving a plurality of discrete vertical stack structures composed of a plurality of layers 2A, the dummy channel layers sacrificial layer 3, the channel layer 4, the buffer layer 5A, and the insulating spacer layer 6, while the vertical stack structures constitute the memory cell regions of the device, the interregional spaces between the stack structures are used for future formation regions of common sources. The layers 2B can be removed by wet etching using hot phosphoric acid if made of for example silicon nitride, or using HF-based etching solution if made of for example silicon oxide, or using KOH, TMAH and other strong alkaline etching solutions if made of polycrystalline silicon, amorphous silicon or microcrystalline silicon, or using oxygen plasma dry etching if made of carbon-based materials such as amorphous carbon, DLC, etc. After removing layers 2B, lateral recesses are left between a plurality of layers 2A, which will be used to form the gate stack structure later.

Figure 10:
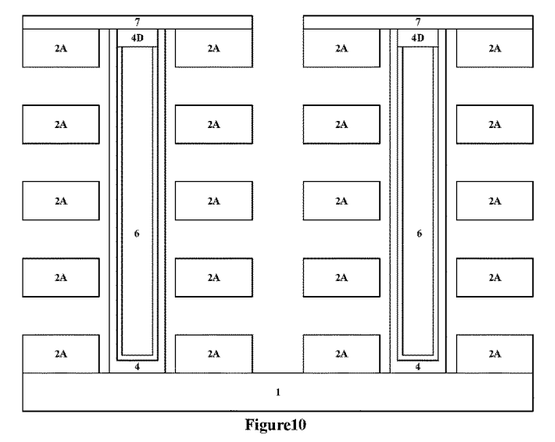

As shown in FIG. 10, the dummy channel sacrificial layer 3 is removed, for example, using the hot phosphoric acid etching solution to remove layer 3 made of silicon nitride or silicon oxynitride.

Optionally, as shown in FIG. 11, the buffer layer 5B is formed at the front surface of the channel layers 4 (the side facing towards the residual layers 2A of the stack structure). The formation process and material of layer 5B are similar or identical to those of layer 5A as shown in FIG. 5. Similarly, layer 5B is optional, i.e. either layer 5A or 5B exists, or both are double-sided buffer layer, or neither of them exists.

Optionally, as shown in FIG. 12, a second annealing treatment is performed on the front surface of the channel layers 4, in order to further reduce the defects of the interface state on this surface. The annealing process and parameters shown in FIG. 12 are similar or identical to those of the first annealing process shown in FIG. 6. Similarly, the second annealing and the first annealing are both optional, i.e. any one of both annealing processes can be used optionally, or both are used, however, at least one of the annealing processes is preferably performed.

Figure 13:
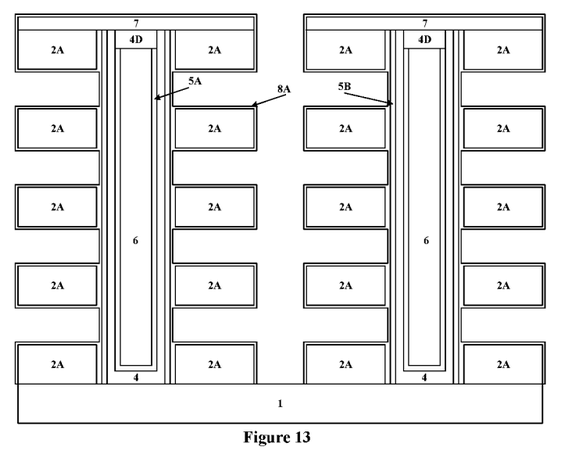

As shown in FIG. 13, the tunneling oxide layer 8A is formed on the remaining structures (i.e., the top of the insulating mask layer 7, the sidewalls and the bottom of the first material layer 2A, the sidewalls of the buffer layer 5B, in other words, the surface of the lateral recesses between layers 2A). The tunneling layer 8A composes $SiO_2$ or high-k material, wherein the high-k materials include, but are not limited to nitride (such as SiN, AlN, TiN), metal oxides (mainly subgroup and lanthanide metal element oxides, such as MgO, $Al_2O_3$, $Ta_2O_5$, $TiO_2$, ZnO, $ZrO_2$, $HfO_2$, $CeO_2$, $Y_2O_3$, $La_2O_3$), nitrogen oxides (e.g., HfSiON), perovskite-phase oxide (e.g. $PbZr_xTi_{1-x}O_3$(PZT), $Ba_xSr_{1-x}TiO_3$(BST)), and etc. The tunneling layer 8A may be monolayer or multilayer stacked structure of the above materials. The deposition processes of layer 8A include PECVD, HDP-CVD, MOCVD, MBE, ALD and the like.

Figure 14:
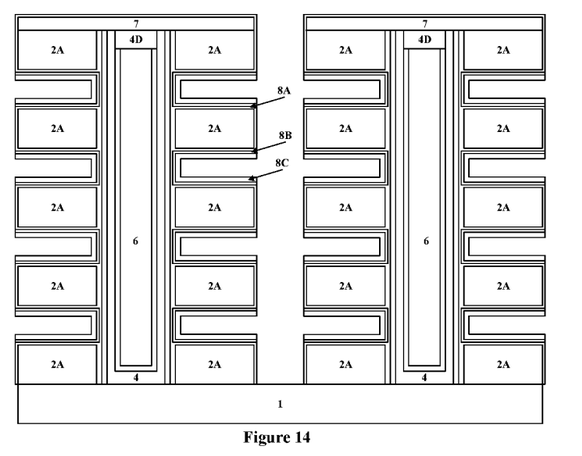

As shown in FIG. 14, the storage layer 8B and the barrier layer 8C are sequentially formed over the tunneling oxide layer 8A. storage layer 8B is dielectric material with charge trapping capabilities, e.g., SiN, HfO, ZrO, etc., and combinations thereof, also may be the monolayer structure or multilayer stacked structure of the above materials. Barrier layer 8C may be the monolayer or multilayer stacked structure of dielectric materials such as silicon oxide, aluminum oxide, hafnium oxide and the like. Layers 8A, 8B and 8C together constitute the (stack structure of) gate dielectric layer of the transistor in the device cell region.

Figure 15:
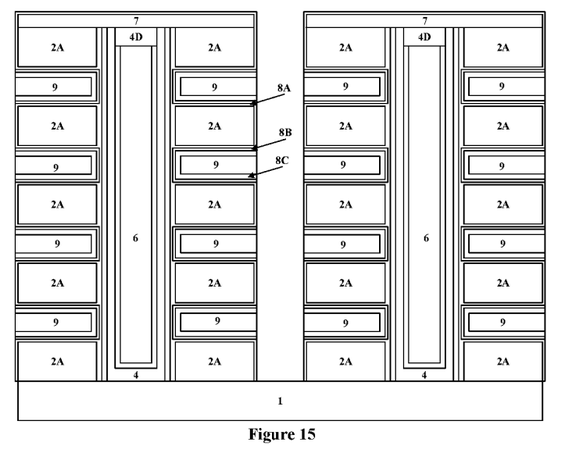

As shown in FIG. 15, a gate conductive layer 9 is formed on layer 8C by filling the lateral recesses between layers 2A. The gate conductive layers 9 may be polycrystalline silicon, a polycrystalline silicon-germanium, or metals, wherein the metals may comprise metal elements such as Co, Ni, Cu, Al, Pd, Pt, Ru, Re, Mo, Ta, Ti, Hf, Zr, W, Ir, Eu, Nd, Er, La and the others, or alloys of these metals and the nitrides of these metals. The gate conductive layers 9 may also be doped with C, F, N, O, B, P, As and other elements to adjust the work function. The metal nitrides (not shown) are preferably formed between the gate dielectric layer 8 and the gate conductive layer 9 by PVD, CVD, ALD and other conventional processes, of which the material includes $M_xN_y$, $M_xSi_yN_z$, $M_xAl_yN_z$, $M_aAl_xSi_yN_z$, wherein the M is Ta, Ti, Hf, Zr, Mo, W, or other elements. Likewise, layer 9 may be a monolayer structure, or also be a multilayer stacked structure.

Figure 16:
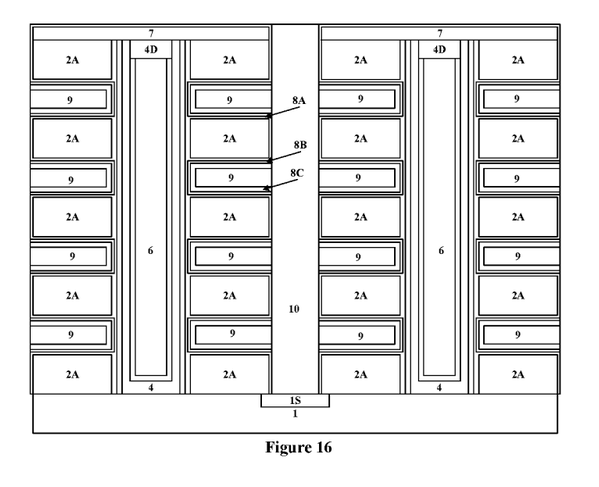

As shown in FIG. 16, a common source region 1S is formed inside substrate 1 and between the adjacent vertical stack structures. The (common) source regions 1S can be formed by doping with ionic implanted, and preferably by forming metal silicides (not shown) on the surface. The metal silicides are such as $NiSi_{2-y}$, $Ni_{1-x}Pt_xSi_{2-y}$, $CoSi_{2-y}$ or $Ni_{1-x}Co_xSi_{2-y}$, wherein the x is greater than 0 and less than 1, and the y is greater than or equal to 0 and less than 1. Thereafter, an inter-layer dielectric layer (ILD) 10 made of insulating materials (e.g., silicon oxide, low-k material) is deposited on the entire device, filling the gaps between the various discrete vertical structures, in order to ensure electrical insulating isolation between the various lateral transistor stack structures.

Figure 17:
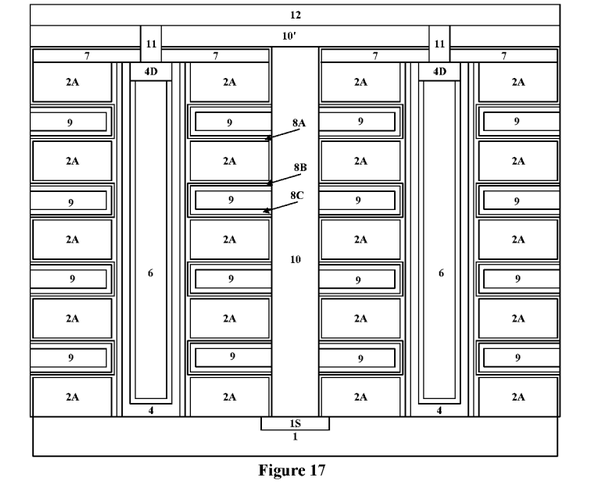

As shown in FIG. 17, the ILD layer 10 and the insulating mask layer 7 are etched, forming the word-line contact holes exposing the drain regions 4D, the holes are filled with metal material to form contact plugs 11, and then the metal wirings 12 used for the bit-line of the device cell are formed over the contact plugs 11. The interregion between the contact plug 11 and the metal wiring 12 can be filled with the ILD layer 10'.

Thereby the final device structure is shown in FIG. 17, it comprises the channel layers 4 which projects perpendicularly from the substrate 1, and the inter-layer insulating layers 2A and the gate stack structure 8A/8B/8C/9 which are alternately stacked along the sidewalls of the channel layers 4, wherein the buffer layer 5A/5B is formed on at least one surface of the channel layers 4, in order to reduce the interface state defects of the channel layers 4's surface and improve the device reliability.

Figure 18:
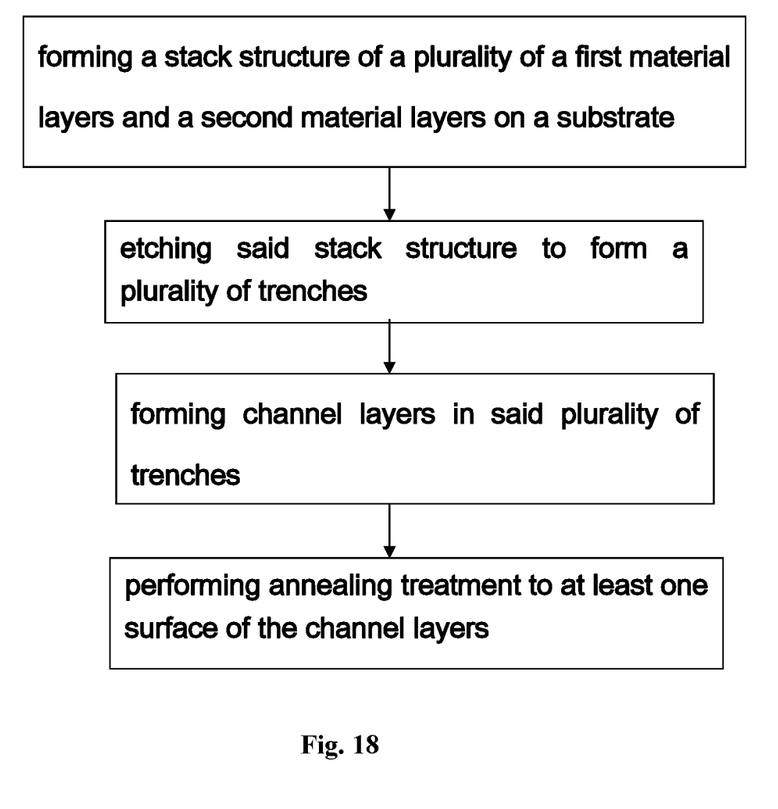
FIG. 18 is a schematic flowchart of the three-dimensional semiconductor device manufacturing method in accordance with the present invention.

FIG. 18 shows a flowchart of the semiconductor device manufacturing method. It is worthily noted that, the flowchart only shows a preferred embodiment of the present invention, the present invention can be implemented as long as the buffer layer is formed on at least one surface of the channel layer 4 and an annealing treatment is performed to reduce the surface defects In addition, another preferred embodiment of the present invention not shown in FIG. 1 to FIG. 17 may include the steps of:

depositing a stack structure of a plurality of a first and a second material layers 2A/2B as shown in FIG. 1, wherein the first material layers are made of the same material of the gate conductive layer 9 as described above, e.g., comprising polycrystalline silicon, amorphous silicon, microcrystalline silicon, or a metal doped semiconductor or a conductive metal structure used for the control gate, the other layers are made of insulating dielectric material to form the inter-layer insulating layer;

etching to define the channel region as shown in FIG. 2;

depositing the channel layers 4 in the trenches 2TP;

optionally depositing the buffer layer 5 on the back surface of the channel layers 4;

performing annealing process (optionally using the atmosphere including said surface treatment gas) to reduce the surface defects of the channel layers 4;

filling with insulating material over the buffer layer 5 surrounded by the channel layers 4 to form the insulating spacer layer 6.

In other words, another embodiment of the invention employs the gate-first process (a gate stack structure is included in the stack structure 2), and one surface of the channel layers 4 are annealed to reduce the defect density of interface states.

In accordance with the three-dimensional semiconductor device manufacturing method of the present invention, introducing a dummy channel sacrificial layer for the interface treatment of the channel surface and back surface, which depresses the formation of interface states, and/or introducing a buffer layer on the channel surface and back surface during the treatment, which can reduce the channel surface roughness, improve the channel carrier mobility, improve the channel current as well as the reliability of the memory cell.

Although the present invention is described with one or more exemplary embodiments, one skilled in the art will recognize that various appropriate changes and equivalents of the device structures can be made without departing from the scope of the present invention. Furthermore, a great deal of modifications of specific situation or materials can be made to the disclosed enlightenment without departing from the scope of the present invention. Thus, the intent of the present invention is not limited to the disclosed illustrative examples for implementing the best embodiments. The disclosed device structures and the method of manufacturing the same will include all the exemplary embodiment within the scope of the invention.

The foregoing amendment introduces to the incomplete sentence found in the substitute Specification as submitted on 9 Feb. 2017 the language found on page 17 of Specification submitted on 14 Nov. 2016. Respectfully, no new matter is introduced by this amendment.

What is claimed is that:

1. A method of manufacturing three-dimensional semiconductor device, comprising the steps of: forming a stack structure of a plurality of a first material layers and a second material layers on a substrate of a memory cell region; etching said stack structure to form a plurality of trenches; forming a dummy channel sacrificial layer on sidewalls of said plurality of trenches; forming channel layers in said plurality of trenches and on sidewalls of the dummy channel sacrificial layer; performing annealing treatment to at least one surface of the channel layers to reduce the surface roughness and the interface state; and removing the dummy channel sacrificial layer.

2. The method of manufacturing three-dimensional semiconductor device of claim 1, wherein, the material of said dummy channel sacrificial layer comprises silicon nitride, silicon oxynitride or combinations thereof, and having a high etching selectivity ratio to the material of the first material layers and/or the second material layers.

3. The method of manufacturing three-dimensional semiconductor device of claim 1, wherein, after forming said channel layers but before said annealing treatment, further comprising forming a buffer layer on at least one surface of said channel layers.

4. The method of manufacturing three-dimensional semiconductor device of claim 3, wherein, the material of the buffer layer includes silicon oxide, silicon nitride, silicon oxynitride, or combinations thereof.

5. The method of manufacturing three-dimensional semiconductor device of claim 3, wherein, said buffer layer is formed on the surface of said channel layers facing towards and/or back away from said stack structure.

6. The method of manufacturing three-dimensional semiconductor device of claim 1, wherein, said annealing treatment is performed at a gas atmosphere containing nitrogen group, fluoro group, chloro group, bromo group, or combinations thereof.

7. The method of manufacturing three-dimensional semiconductor device of claim 1, wherein, after the surface of the channel layer facing back away from said stack structure is annealed, filling the channel layers with an insulating spacer layer and forming drain regions of the device transistor.

8. The method of manufacturing three-dimensional semiconductor device of claim 7, wherein, after forming said drain regions, further comprising selectively removing the second material layers, leaving a plurality of discrete vertical stack structures on the substrate, exposing the surface of the channel layers facing towards said first material layers.

9. The method of manufacturing three-dimensional semiconductor device of claim 8, wherein, the surface of the channel layers facing towards said first material layers are annealed.

10. The method of manufacturing three-dimensional semiconductor device of claim 9, wherein, before the annealing treatment of the surface of the channel layers facing towards said first material layers, further comprising forming a buffer layer on the surface of the channel layers facing towards said first material layers.

11. The method of manufacturing three-dimensional semiconductor device of claim 1, wherein, after said annealing treatment to at least one surface of the channel layers, further comprising forming a plurality of lateral recesses on sidewalls of said plurality of trenches in said stack structure, and then forming a plurality of gate stack structures composed of a gate dielectric layer and a gate conductive layer in said plurality of recesses; forming a plurality of source regions in said substrate.

12. The method of manufacturing three-dimensional semiconductor device of claim 11, wherein, said gate dielectric layer further comprises a tunneling layer, a storage layer and a barrier layer.

13. The method of manufacturing three-dimensional semiconductor device of claim 11, wherein, between said gate dielectric layer and said gate conductive layer a metal nitride layer may be included.

14. The method of manufacturing three-dimensional semiconductor device of claim 1, wherein, the cross-sectional shape of the channel layers parallel to the substrate surface comprises geometric shapes selected from rectangular, square, diamond, circular, semi-circular, elliptical, triangular, pentagonal, hexagonal, octagonal and the combinations thereof, and includes those selected from solid geometry, hollow annular geometry, or a combination of a hollow annular peripheral layer and a central insulating layer as a result of revolution of geometric shapes.

15. The method of manufacturing three-dimensional semiconductor device of claim 1, wherein, both of the materials of said first material layers and said second material layers include insulating material, furthermore the first material layers have a first etch selectivity, and the second material layers have a second etch selectivity which is different from the first etch selectivity.

16. The method of manufacturing three-dimensional semiconductor device of claim 1, wherein, the material of the first material layers comprise insulating material, the material of the second material layers may comprise doped semiconductor material or conductive material used to form control gates.

* * * * *